(12) United States Patent
Zehavi et al.

(10) Patent No.: US 6,727,191 B2
(45) Date of Patent: Apr. 27, 2004

(54) HIGH TEMPERATURE HYDROGEN ANNEAL OF SILICON WAFERS SUPPORTED ON A SILICON FIXTURE

(75) Inventors: Raanan Y. Zehavi, Sunnyvale, CA (US); James E. Boyle, Saratoga, CA (US); Laurence D. Delaney, Whitefish, MO (US)

(73) Assignee: Integrated Materials, Inc., San Jose, CA (US)

( * ) Notice: Subject to any disclaimer, the term of this patent is extended or adjusted under 35 U.S.C. 154(b) by 0 days.

(21) Appl. No.: 09/792,989

(22) Filed: Feb. 26, 2001

(65) Prior Publication Data

US 2002/0119641 A1 Aug. 29, 2002

(51) Int. Cl.[7] .............................................. H01L 21/26
(52) U.S. Cl. ........................................ 438/795; 118/724
(58) Field of Search ................................ 438/795, 406, 438/455, 479, 458–459, 964; 118/500, 728–730, 724–725

(56) References Cited

U.S. PATENT DOCUMENTS

| | | | | |
|---|---|---|---|---|
| 5,492,229 A | * | 2/1996 | Tanaka et al. | 211/41.18 |
| 5,516,283 A | * | 5/1996 | Schrems | 432/241 |
| 5,534,074 A | * | 7/1996 | Koons | 118/728 |
| 5,586,880 A | * | 12/1996 | Ohsawa | 432/241 |
| 5,595,604 A | * | 1/1997 | Kobayashi et al. | 118/715 |
| 5,752,609 A | * | 5/1998 | Kato et al. | 211/41.18 |
| 5,779,797 A | * | 7/1998 | Kitano | 118/500 |
| 5,858,103 A | * | 1/1999 | Nakajima et al. | 118/728 |
| 5,931,666 A | * | 8/1999 | Hengst | 432/258 |
| 6,065,615 A | * | 5/2000 | Uchiyama et al. | 211/41.18 |
| 6,171,982 B1 | * | 1/2001 | Sato | 438/795 |
| 6,180,497 B1 | * | 1/2001 | Sato et al. | 438/458 |
| 6,284,997 B1 | * | 9/2001 | Zehavi et al. | 219/121.46 |
| 6,450,346 B1 | * | 9/2002 | Boyle et al. | 211/41.18 |

FOREIGN PATENT DOCUMENTS

| | | |
|---|---|---|
| EP | 0 884 769 A 1 | 12/1998 |
| WO | WO 00/21119 | 4/2000 |

OTHER PUBLICATIONS

Anonymous, "Epi–II advanced Wafer," *MEMC Appplications Note*, AE–003, Mar. 2000, pp. 1–4.
Anonymous, "Thin epi layers shown to improve gate oxide integrity performance," MEMC, date unknown, 1.p.

* cited by examiner

*Primary Examiner*—David Nelms
*Assistant Examiner*—David Vu
(74) *Attorney, Agent, or Firm*—Charles Guenzer

(57) ABSTRACT

A process for hydrogen annealing silicon wafers that have been cut from an ingot and polished on both sides, thereby removing crystal originated pits (COPs) in their surface. The wafers are then stacked in a tower having at least support surfaces made from virgin polysilicon, that is, polysilicon form by chemical vapor deposition, preferably from monosilane. The tower may include four virgin polysilicon legs have support teeth slotted along the legs and fixed at their opposed ends to bases. The wafers are supported at four equally distributed points at 0.707 of the wafer radius. The wafers so supported on the virgin polysilicon towers are annealed in a hydrogen ambient at 1250° C. for 12 hours.

21 Claims, 3 Drawing Sheets

HIGH TEMPERATURE HYDROGEN ANNEAL OF SILICON WAFERS SUPPORTED ON A SILICON FIXTURE

BACKGROUND OF THE INVENTION

1. Field of the Invention

The invention relates generally to semiconductor processing. In particular, the invention relates to the method and apparatus for removing defects from a silicon wafer prior to device fabrication.

2. Background Art

The increased density of devices formed on advanced silicon integrated circuits has required raw silicon wafers to have a further reduced density of defects. Although silicon wafers are substantially monocrystalline, they may suffer from several types of surface and bulk defects.

A slip defect occurs when the silicon is not perfectly monocrystalline. Instead, boundaries may develop in the bulk silicon across which the silicon atoms do not perfectly line up. Slip is believed to arise from shear stress. If the slip is large, a silicon plane on one side of the boundary may gradually transition between multiple silicon planes on the other side. Such a large slip renders that part of the silicon wafer essentially useless for integrated circuits. There are various degree of slip, but nearly invariably slip propagates and worsens with additional thermal processing. Strain introduced by slip can cause substantial difficulties, such as accelerated dopant diffusion in the vicinity of the strained material, resulting in a non-uniform diffusion density, or concentration of impurities around the slip.

We believe that many occurrences of slip arise during high temperature processing steps in which the silicon wafer moves over a supporting surface of a wafer fixture, such as a boat or tower, primarily because of differential thermal expansion of the two materials. Slip seems to become a particular problem when minimum feature sizes are less than 0.18 $\mu$m, which is the approximate size for advanced processing at the current time.

Another type of defect produces what are called crystal originated pits (COPs), which are agglomerated vacancy defects occurring at the wafer surface. Crystalline silicon typically contains a significant number of atomic defects in the form of vacancies and interstitials. The vacancies tend to agglomerate into larger voids distributed throughout the silicon. Any such void exposed at the wafer surface appears as a pit. These voids and pits are generally formed in what is otherwise a uniform, monocrystalline wafer. COPs become a major problem at minimum feature sizes of 0.13 $\mu$m, the size being contemplated for the next generation of integrated circuits.

There are several conventional methods of reducing if not eliminating the occurrence of crystal originated pits. In one method, the wafer is cut from a Czochralski-grown or float-zone crystallized ingot, is rounded, and has flats or other orienting indicia cut into its periphery. For some applications such as solar cells, the silicon wafer may be polycrystalline. The wafer is often then polished on both sides although in the past polishing has been limited to one side. At this stage, a large number of COPs are typically present. In one method to remove the COPs, the wafer is then annealed at high temperature, for example, 12 hours at 1250° C., in a hydrogen environment. The high temperature promotes diffusion of silicon interstitials into the pits, thus planarizing the surface and eliminating the pits. The hydrogen is beneficial in promoting the diffusion of interstitials throughout the silicon wafer. The mobilized interstitials fill the surface pits.

The high-temperature COP anneal has not however been completely successful. One problem is that the annealing temperature is not that far below the melting point of silicon, which is approximately 1414° C. The long, hot COP anneal is likely to cause the silicon wafer supported at a minimum number of points to sag. Even if the wafer returns to its planar shape upon cooling, stress is likely to be thereby introduced. Sag becomes even more of a problem as the transition progresses from 200 mm to 300 mm wafers.

Quartz boats and towers are inadequate for these high temperatures because they sag at these temperatures. As a result, silicon carbide boats or towers are typically used for high-temperature processing because silicon carbide remains strong at significantly higher temperatures. However, silicon carbide presents its own set of problems. It is likely to contain a significant concentration of heavy metals, which are also mobilized by the high-temperature hydrogen anneal and which are very deleterious to semiconductor devices into which the heavy metals may diffuse. Solutions are available to address these problems, but they are both expensive and not completely effective.

It is further been observed that a COP anneal or other high-temperature anneal using a silicon carbide tower, even of the best design, is likely to introduce slip at the locations at which the tower supports the wafer. We believe the slip arises due to the differential coefficients of thermal expansion between silicon and silicon carbide and due to the silicon carbide being harder than silicon.

For these reasons, it is desired to provide a method and apparatus for more effectively performing a high temperature anneal of a silicon wafer.

SUMMARY OF THE INVENTION

The invention includes an annealing method for removing defects from a stock silicon wafer after it has been cut from an ingot and preferably polished on both sides. A plurality of wafers are stacked in a support fixture, for example, a vertically extending tower, having at least support surfaces composed of silicon, preferably virgin polysilicon.

More preferably, the tower is composed of three or four silicon legs, preferably composed of virgin polysilicon, joined to two end bases. Slots are cut into the four legs to form inclined teeth having support surfaces disposed at locations corresponding to about 0.707 of the wafer radius. These locations equalize the mass of the wafer inside and outside of the support points. The support points for four legs are preferably arranged in a rectangular pattern centered, most preferably a square pattern, centered about the wafer center, thereby reducing wafer sag. The support points for three legs are preferably arranged in a pattern of an equilateral triangle centered on the wafer center.

The wafers supported in the silicon tower are subjected to a high-temperature anneal in a hydrogen ambient, for example, at 1250° C. for 12 hours.

The tower may also be advantageously used for other processes involving high temperatures above 1100° C. and may also be used for lower-temperature processes.

DETAILED DESCRIPTION OF THE PREFERRED EMBODIMENTS

We believe that silicon carbide, even covered with a layer of CVD silicon carbide, is inappropriate for use as support towers in high-temperature processing of silicon wafers. Silicon carbide is a hard material, and a significant differential coefficient of thermal expansion (CTE) exists between silicon and silicon carbide so that the silicon wafers and silicon carbide tower move relatively to each other as they are cycled up to the annealing temperature and back down to room temperature. During the temperature cycle, the differential thermal expansion causes the silicon wafer to drag over the harder silicon carbide. So far, perfectly smooth silicon carbide has not been available, and in any case there would still be dragging at some level. Furthermore, we believe that metals will inevitably diffuse from the silicon carbide into the silicon, particularly over the long periods of commercial production desired for expensive towers.

According to one aspect of the invention, a tower or boat used to support wafers in a high-temperature anneal of stock silicon wafers has at least support surfaces formed of silicon, preferably polysilicon, and more preferably virgin polysilicon. Boyle et al. have disclosed the fabrication of such a tower in U.S. patent application, Ser. No. 09/608,291, filed Jun. 30, 2000, now issued as U.S. Pat. No. 6,455,395, and incorporated herein by reference in its entirety. Virgin polysilicon is polycrystalline silicon formed by the chemical vapor deposition (CVD) of silane and/or chlorosilane. Virgin polysilicon is conventionally used as the source material for the Czochralski growth of monocrystalline silicon ingots. Although trichlorosilane ($CHCl_3$) is the most prevalently used CVD precursor for semiconductor applications, virgin polysilicon formed from monosilane ($SiH_4$) is preferred for towers because of the absence of trace amounts of chlorine. Virgin polysilicon of extraordinarily high purity is commercially available.

Figure 1:
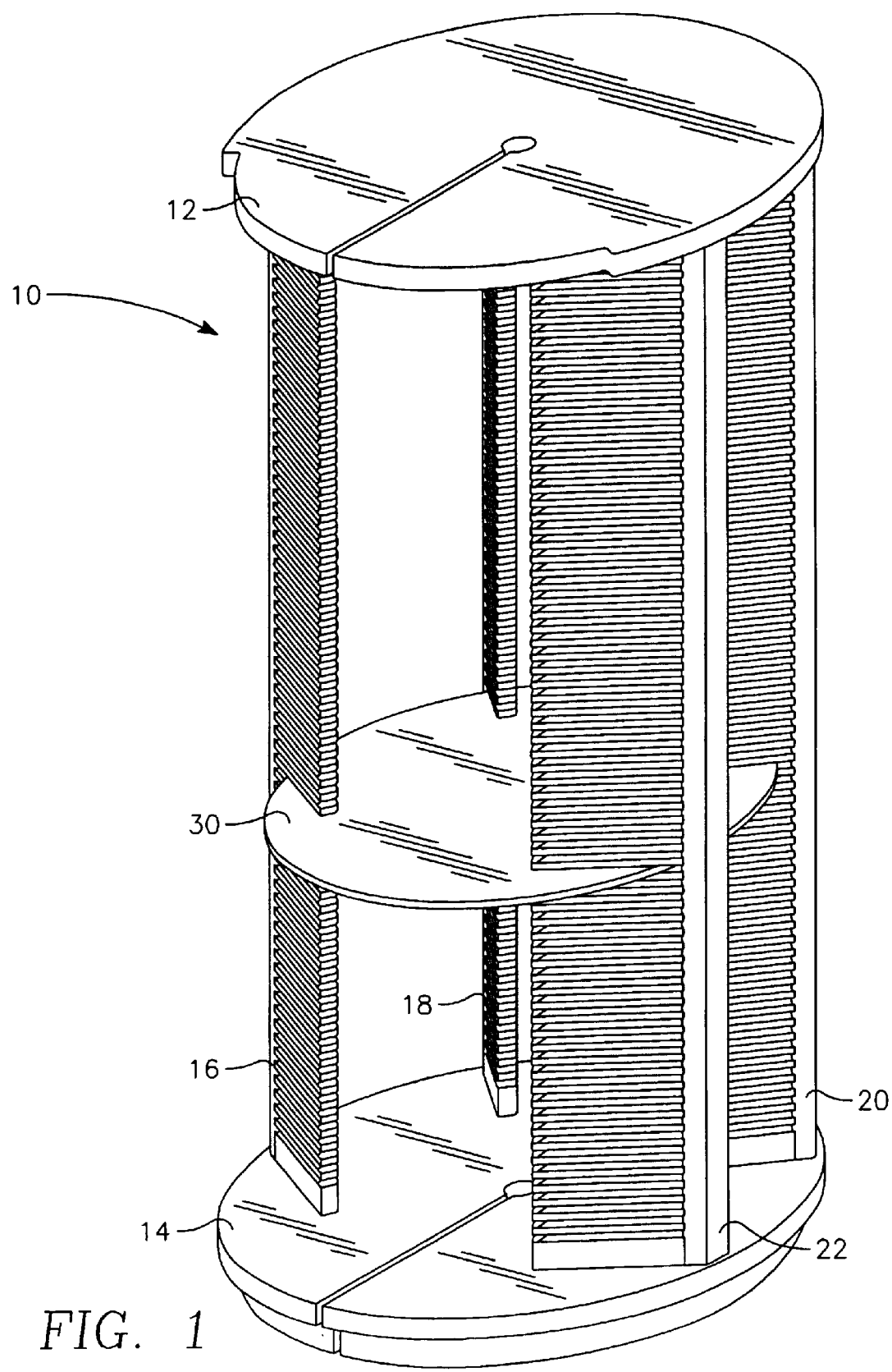
FIG. 1 is an orthographic view of a silicon tower usable in the process of the invention.
Figure 2:
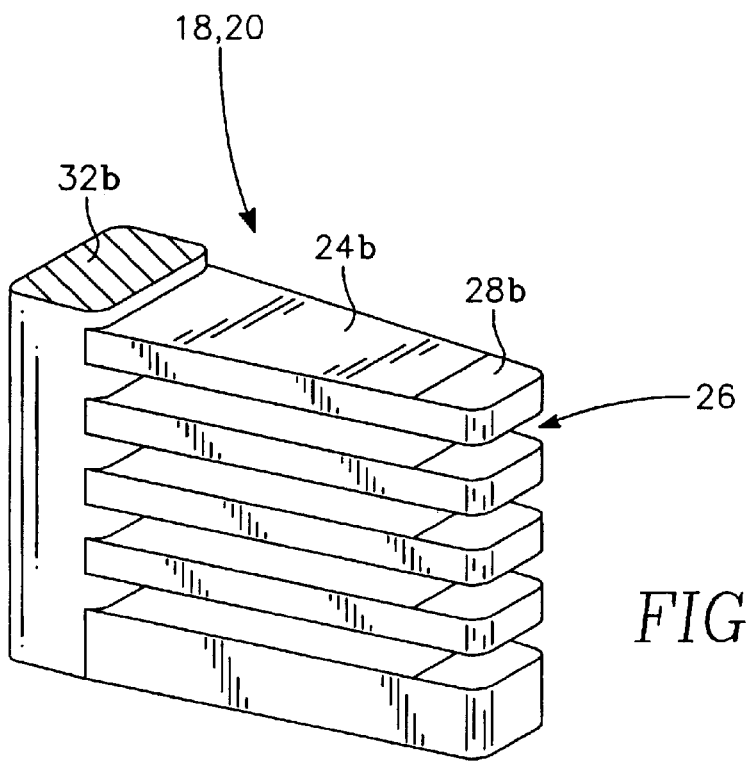
FIG. 2 is an exploded orthographic view of one of the legs of the tower of FIG. 1.

A form of a tower 10 is illustrated in the orthographic view of FIG. 1. It includes two bases 12, 14 and four legs 16, 18, 20, 22 permanently affixed at opposed ends to the two bases 12, 14. Preferably, at least the legs 16, 18, 20, 22 and, more preferably, also the bases 12, 14 are machined from separate pieces of silicon. The legs 16, 18, 20, 22 are more preferably machined from virgin polysilicon since they contact and support the wafers. The bases 12, 14 need not be fabricated from virgin polysilicon because they do not contact the silicon wafers. All the pieces are then joined together. The machining and joining processes are described in the cited patent application to Boyle et al. Each leg 16, 18, 20, 22 has a large number of generally parallel teeth 24, more clearly shown in the expanded orthographic view of FIG. 2 for the legs 18, 20 with short teeth 24b, which are machined into the legs to form slots 26 between the teeth 24. FIG. 1 has been simplified. In one product, 118 sets of teeth are spaced along about 1 m of a tower to support a large number of wafers 30 in a horizontal, parallel arrangement.

Figure 3:
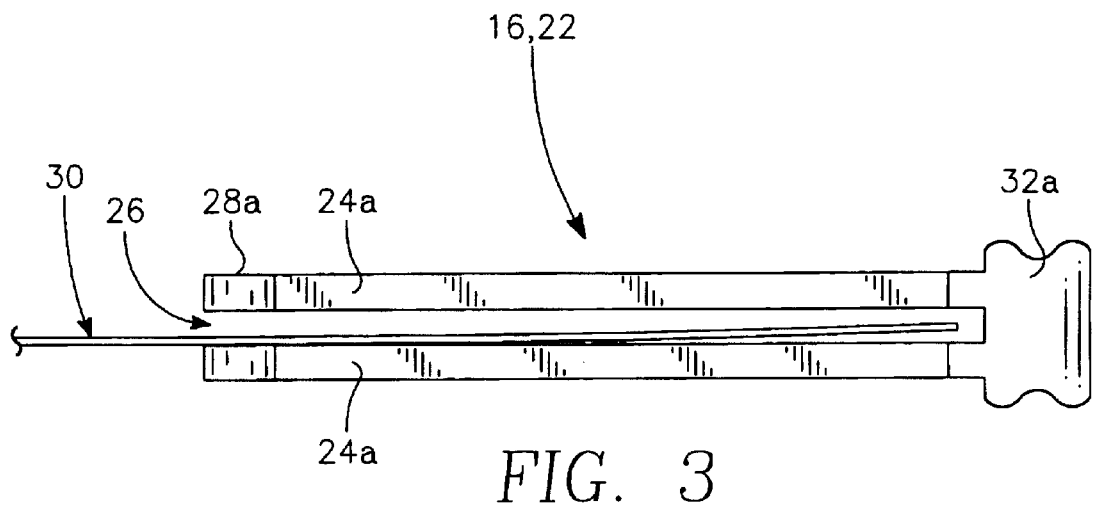
FIG. 3 is an exploded elevational view of the teeth and stem portion of one of the legs of the tower of FIG. 1.

As more clearly shown in the detailed elevational view of FIG. 3, the teeth 24a, 24b are cut to incline upwardly at a set angle of between 87° and 89½° from the axis of the legs, but level support areas 28a, 28b are machined into the end of the teeth 24a, 24b to support a wafer 30 at a total of four points far removed from the leg stems 32a, 32b.

For presently developed silicon integrated circuit technology, it does not appear necessary to polish the support areas 28, 28b. However, it is anticipated that as the circuit technology advances, polishing may be required. There are two types of polishing contemplated. Chemical mechanical polishing (CMP) uses a silica slurry in an alkaline colloidal suspension and produces a very smooth, damage-free surface. Diamond polishing with small (1 to 3 $\mu$m) abrasive particles can produce an equally smooth surface but with substantial sub-surface work damage.

Figure 4:
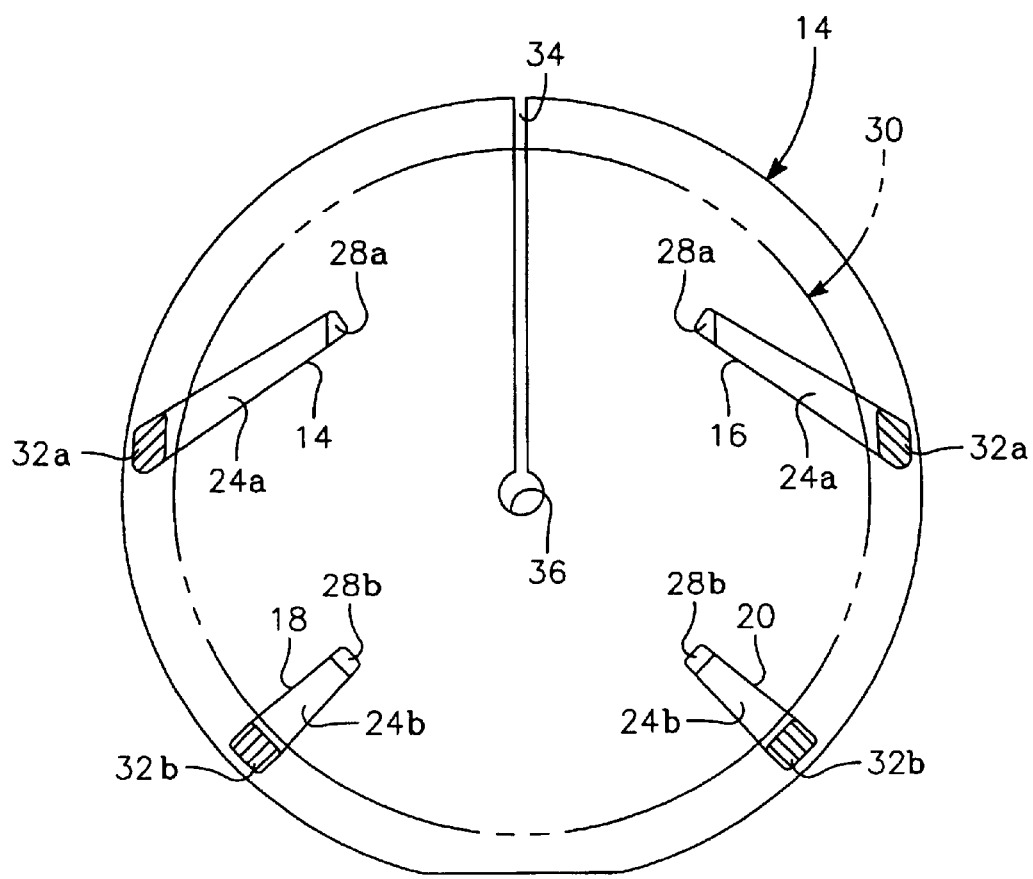
FIG. 4 is an axial sectioned view of the tower of FIG. 1 illustrating the arrangement of teeth and support areas.

As shown in both the orthographic view of FIG. 1 and the axially sectioned view of FIG. 4, two legs 14, 16 having long teeth 24a projecting from their leg stems 32a are located on the side of the tower while two legs 18, 20 having shorter teeth 24b are located on the other side. The shorter teeth 24b project generally radially inwardly from their leg stems 32b with respect to the center of the tower 10 while the longer teeth 24a project towards the entry side of the tower to allow insertion of the wafers. The distance between the leg stems 32a of the longer-tooth legs 16, 22 is slightly larger than the diameter of the wafer 30 being inserted into the tower. This geometry allows all support surfaces 28a, 28b to form a square pattern at locations corresponding to about 0.707 ($2^{-1/2}$) of the wafer radius. A rectangular pattern and more advantageously a square pattern reduce the maximum sag for points of the wafer far removed from the support surfaces. The radial position corresponds to a radius having an equal weight of wafer inside and out, thereby minimizing thermally induced sag and sag deformation and stress. A variation of 5% about this radius should introduce no significant problems, but in fact the support areas 28a, 28b are large enough to easily encompass the 0.707 position. Expansion slots 34 cut into the bases 14, 16 along the wafer insertion direction connected to a center relief circle 36 relieve any thermal stresses built up in the bases.

An alternative tower design uses three legs with the support areas arranged in the pattern of a triangle, preferably an equilateral triangle, symmetrically arranged about the wafer center and preferably disposed at the 0.707 positions. The three-point support increases chip yield since almost invariably the supported area of the wafer does not produce a working chip. However, the triangular support pattern produces a larger maximum sag. Hence, the choice of three or four legs is based at least partially on the maximum processing temperature.

Such towers are capable of supporting wafers for extended periods in a high temperature anneal. The entire tower is formed of silicon so differential thermal expansion between it and the wafers is minimized. The silicon material, particularly at the supporting areas, has substantially the same hardness as the silicon wafers being supported. Accordingly, even if there is some dragging of the wafer on the tower surfaces, the dragging is unlikely to induce defects in the wafer. The placement of the teeth support surfaces minimizes sag and strain in the wafer, thereby reducing if not eliminating slip in the crystalline silicon wafer material. Because at least the legs may be formed of virgin polysilicon of very high purity, particularly in regards to heavy metals, impurity diffusion from the tower to the wafers is substantially eliminated.

Figure 5:
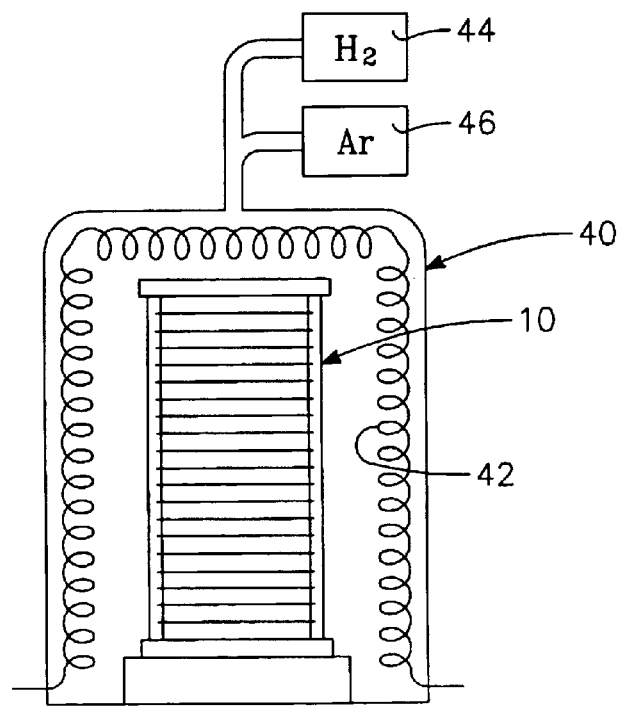
FIG. 5 is a simplified schematic representation of an annealing oven in which the method of the invention may be practiced.

Such a tower is consistent with the cited hydrogen anneal at 1250° C. for 12 hours. Wafers are loaded into the above described silicon tower 10. The loaded tower 10 is placed in a conventional annealing oven 40, schematically illustrated in FIG. 5, which is controllably heated by resistive heaters 42 to the desired annealing temperature. Hydrogen and argon gas are flowed into the annealing oven 40 from gas supplies 44, 46 to supply the 25% $H_2$ ambient that is substantially otherwise inert. The anneal is continued for the desired time of, for example, 12 hours.

Experiments have shown that such an anneal all but eliminates the crystal originated pits (COPs) without introducing any detectable slip into the wafers. Of course, the invention is not limited to this particular annealing schedule. Somewhat higher temperatures, of course below the melting point of silicon of 1414° C., will shorten the required annealing time. An annealing time of at least an hour is believed necessary to produce the desired interstitial diffusion below annealing temperatures that would soften the silicon. Temperatures as low as 1100° C. will produce a desired effect, but with the requirement of longer annealing times. Further, it is apparent that such a high-temperature tower can be used for processes involving lower temperatures. Indeed, use of lesser quality quartz or silicon carbide towers for medium-temperature processing after the high-temperature hydrogen anneal with a silicon tower of the invention is likely to compromise the purity and slip-free crystalline state of the wafer.

Other hydrogen-containing processing gases may be used with the high-temperature hydrogen anneal of the invention. Forming gas is a commercially available gas that is considered relatively non-explosive. It contains 5 to 7% of $H_2$ by volume, the remainder being $N_2$, which in many applications is considered inert. Thus, a minimum of 5% $H_2$ in an otherwise inert carrier will provide a beneficial high-temperature anneal.

Although a vertically oriented tower has been described, the same effects can be achieved with a horizontally oriented boat, assuming the annealing oven is configured for a boat. The invention is not limited to the processing of silicon wafers. Other substrate materials, for example, silica optical boards, require high-temperature processing that would benefit from the above described silicon support fixture.

The invention becomes increasingly more important with the advent of the larger 300 mm wafers and a further reduction in minimum feature sizes below the typical sizes of COPs and slip. However, the invention may as well be applied to the smaller wafer most prevalent at the present time.

What is claimed is:

1. A high-temperature annealing process, comprising the steps of:

supporting a plurality of silicon substrates on a support fixture having support surfaces consisting essentially of silicon, wherein said support fixture comprises a plurality of legs composed of virgin polysilicon and including teeth projecting from stem portions of said legs, said support surfaces being formed at ends of said teeth;

placing said support fixture supporting said silicon substrates into an annealing oven;

flowing a hydrogen ambient into said annealing oven; and annealing said silicon substrates in said hydrogen ambient at an annealing temperature of at least 1100° C.

2. The process of claim 1, wherein there are four of said legs and said support surfaces are disposed in a square pattern to support said substrates.

3. The process of claim 2, wherein said support surfaces are disposed in said square pattern at locations located at approximately 0.707 of four radii of said substrate.

4. The process of claim 1, wherein there are three of said legs and said support surfaces are disposed in an equilateral triangle to support said substrates at locations located at approximately 0.707 of three radii of said substrate.

5. The process of claim 1, wherein said substrates are substantially circular silicon wafers, further comprising the prior steps of:

cutting said wafers from one or more silicon ingots; and polishing at least one side of said wafers.

6. The process of claim 5, wherein said ingots comprise substantially monocrystalline silicon.

7. The process of claim 1, wherein said support surfaces are polished.

8. The method of claim 1, wherein said annealing step reduces a number of crystal originated pits in said silicon substrates.

9. A high-temperature wafer processing method, comprising the steps of:

providing a tower comprising
      a plurality of legs comprising virgin polysilicon and each having a plurality of support areas cut therein along axial lengths thereof, and
      two bases fixed to opposed ends of said plurality of legs;

supporting a plurality of silicon wafers on said support areas; and processing said supported silicon wafers at a processing temperature of at least 1100° C.

10. The method of claim 9, wherein said support areas are formed to face a first direction along said axial lengths on teeth which are cut at angles of between 87° and 89½° with respect to said first direction.

11. The method of claim 10, wherein said plurality of legs consist of four legs and said support surfaces are disposed in a square pattern about a wafer center.

12. The method of claim 10, wherein said plurality of legs comprise three legs and said support surfaces are disposed at 0.707 of three wafer radii in an equilateral triangle pattern about a wafer center.

13. The method of claim 9, wherein said processing includes exposing said wafers to a hydrogen ambient at said processing temperature.

14. The method of claim 13, wherein said processing temperature is at least 1250° C. and is maintained for an extended predetermined length of time.

15. The method of claim 14, wherein said processing reduces a number of crystal originated pits in said silicon wafers.

16. The method of claim 9, wherein said support areas consist essentially of silicon.

17. The method of claim 9, further wherein said support areas are polished.

18. The method of claim 17, wherein said support areas are formed at distal ends of said teeth.

19. A high-temperature substrate treatment process, comprising the steps of:

supporting a plurality of silicon substrates on a support fixture having support surfaces consisting essentially of silicon;

placing said support fixture supporting said silicon substrates into an oven; and treating said silicon substrates in a hydrogen environment at a treatment temperature of at least 1100° C. and continuing said treating for a predetermined extended length of time.

20. The process of claim 19, wherein said support surfaces are formed from members consisting essentially of virgin polysilicon.

21. The process of claim 19, wherein said treatment temperature is at least 1250° C.

* * * * *